(12) United States Patent
Hsu et al.

(10) Patent No.: US 10,395,991 B2
(45) Date of Patent: Aug. 27, 2019

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chih-Kai Hsu, Tainan (TW); Ssu-I Fu, Kaohsiung (TW); Yu-Hsiang Hung, Tainan (TW); Chun-Ya Chiu, Tainan (TW); Chin-Hung Chen, Tainan (TW); Chi-Ting Wu, Tainan (TW); Yu-Hsiang Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 1 day.

(21) Appl. No.: 15/830,008

(22) Filed: Dec. 4, 2017

(65) Prior Publication Data

US 2019/0172752 A1 Jun. 6, 2019

(51) Int. Cl.
| | |
|---|---|
| H01L 27/088 | (2006.01) |
| H01L 21/8234 | (2006.01) |
| H01L 21/311 | (2006.01) |
| H01L 21/768 | (2006.01) |
| H01L 23/535 | (2006.01) |
| H01L 29/49 | (2006.01) |
| H01L 29/66 | (2006.01) |

(52) U.S. Cl.
CPC ........ *H01L 21/823475* (2013.01); *H01L 21/31111* (2013.01); *H01L 21/31116* (2013.01); *H01L 21/31144* (2013.01); *H01L 21/76816* (2013.01); *H01L 21/76843* (2013.01); *H01L 21/76877* (2013.01); *H01L 21/823437* (2013.01); *H01L 21/823468* (2013.01); *H01L 23/535* (2013.01); *H01L 27/0886* (2013.01); *H01L 29/4991* (2013.01); *H01L 21/823431* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 6,583,046 B1 * | 6/2003 | Okada | H01L 21/02063 257/E21.256 |
| 9,349,833 B1 | 5/2016 | Hung et al. | |
| 9,508,825 B1 * | 11/2016 | Basker | H01L 29/665 |
| 9,548,250 B1 * | 1/2017 | Basker | H01L 21/823821 |
| 9,627,514 B1 * | 4/2017 | Kim | H01L 21/7682 |
| 2008/0308854 A1 * | 12/2008 | Takaishi | H01L 27/10814 257/304 |
| 2015/0206754 A1 * | 7/2015 | Horak | H01L 21/28008 257/288 |
| 2017/0288031 A1 * | 10/2017 | Ho | H01L 29/6656 |

* cited by examiner

*Primary Examiner* — Calvin Y Choi
(74) *Attorney, Agent, or Firm* — Winston Hsu

(57) ABSTRACT

A method for fabricating semiconductor device includes the steps of: forming a first gate structure and a second gate structure on a substrate and an interlayer dielectric (ILD) layer around the first gate structure and the second gate structure; transforming the first gate structure into a first metal gate and the second gate structure into a second metal gate; removing part of the ILD layer between the first metal gate and the second metal gate to form a recess; forming a first spacer and a second spacer in the a recess; performing a first etching process to form a first contact hole; and performing a second etching process to extend the first contact hole into a second contact hole.

20 Claims, 5 Drawing Sheets

SEMICONDUCTOR DEVICE AND METHOD FOR FABRICATING THE SAME

BACKGROUND OF THE INVENTION

1. Field of the Invention

The invention relates to a semiconductor device and fabrication method thereof, and more particularly to a contact plug having different widths and fabrication method thereof.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

As the semiconductor industry enters 10 nm node generation, the contact area of contact plugs largely decreases and results in resistance increase. The quantity of masks used during contact plug formation also increases substantially, creating larger shift in resistance particularly in the active region and affecting the performance of the device. Hence, how to effectively resolve this issue has become an important task in this field.

SUMMARY OF THE INVENTION

According to an embodiment of the present invention, a method for fabricating semiconductor device includes the steps of: forming a first gate structure and a second gate structure on a substrate and an interlayer dielectric (ILD) layer around the first gate structure and the second gate structure; transforming the first gate structure into a first metal gate and the second gate structure into a second metal gate; removing part of the ILD layer between the first metal gate and the second metal gate to form a recess; forming a first spacer and a second spacer in the a recess; performing a first etching process to form a first contact hole; and performing a second etching process to extend the first contact hole into a second contact hole.

According to another aspect of the present invention, a semiconductor device includes: a first metal gate on a substrate and an interlayer dielectric (ILD) layer around the first metal gate; and a contact plug in the ILD layer and adjacent to the first metal gate. Preferably, the contact plug further includes a bottom portion in the ILD layer and a top portion on the bottom portion. Preferably, a width of a bottom surface of the bottom portion is greater than a width of a top surface of the bottom portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
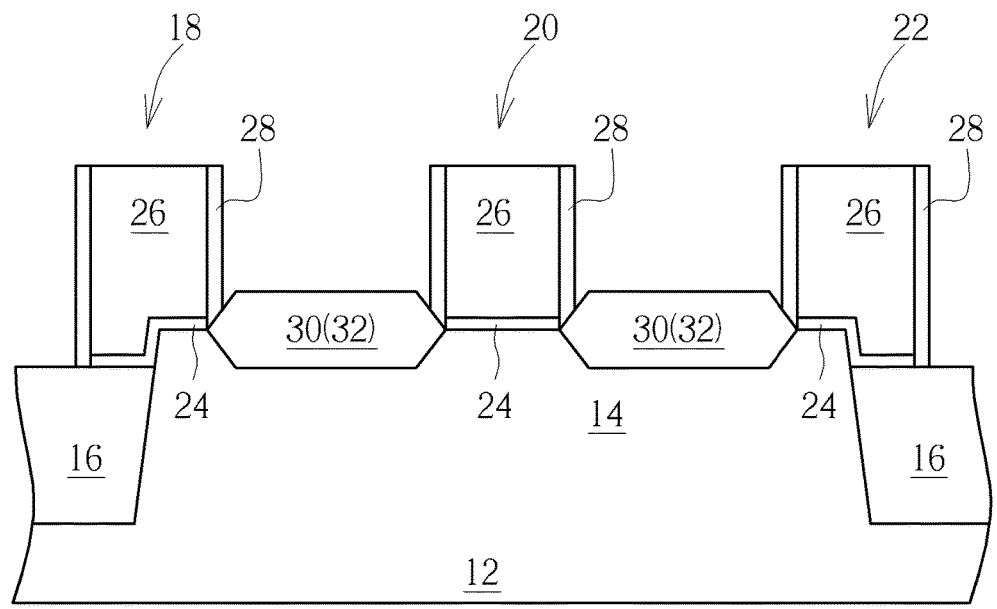
FIGS. 1-9 illustrate a method for fabricating a semiconductor device according to an embodiment of the present invention.

Referring to FIGS. 1-9, FIGS. 1-9 illustrate a method for fabricating a semiconductor device according to an embodiment of the present invention. As shown in FIG. 1, a substrate 12, such as a silicon substrate or silicon-on-insulator (SOI) substrate is first provided, and at least a transistor region such as a NMOS region or a PMOS region are defined on the substrate 12. Next, at least a fin-shaped structure 14 is formed on the substrate 12, in which the bottom of the fin-shaped structure 14 is surrounded by an insulating layer or shallow trench isolation (STI) 16 made of material including but not limited to for example silicon oxide. It should be noted that even though this embodiment pertains to the fabrication of a non-planar FET device such as FinFET device, it would also be desirable to apply the following processes to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, gate structures 18, 20, 22 or dummy gates are formed on the substrate 12. In this embodiment, the formation of the gate structures 18, 20, 22 could be accomplished by a gate first process, a high-k first approach from gate last process, or a high-k last approach from gate last process. Since this embodiment pertains to a high-k last approach, a gate dielectric layer 24 or interfacial layer, a gate material layer 26 made of polysilicon and selective hard mask (not shown) could be formed sequentially on the substrate 12, and a pattern transfer process is then conducted by using a patterned resist (not shown) as mask to remove part of the part of the gate material layer 26 and part of the gate dielectric layer 24 through a single or multiple etching processes. After stripping the patterned resist, gate structures 18, 20, 22 each composed of a patterned gate dielectric layer 24 and a patterned gate material layer 26 are formed on the substrate 12, in which the gate.

Next, at least a spacer 28 is formed on the sidewalls of the each of the gate structures 18, 20, 22, a source/drain region 30 and/or epitaxial layer 32 is formed in the fin-shaped structure 14 adjacent to two sides of the spacer 28, selective silicide layers (not shown) could be formed on the surface of the source/drain regions 30, and a selective contact etch stop layer (CESL) (not shown) is formed on the surface of the fin-shaped structure 14 and the gate structures 16. In this embodiment, the spacer 28 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 30 could include n-type dopants or p-type dopants depending on the type of device being fabricated and the CESL is preferably made of SiN or SiCN, but not limited thereto.

Figure 2:
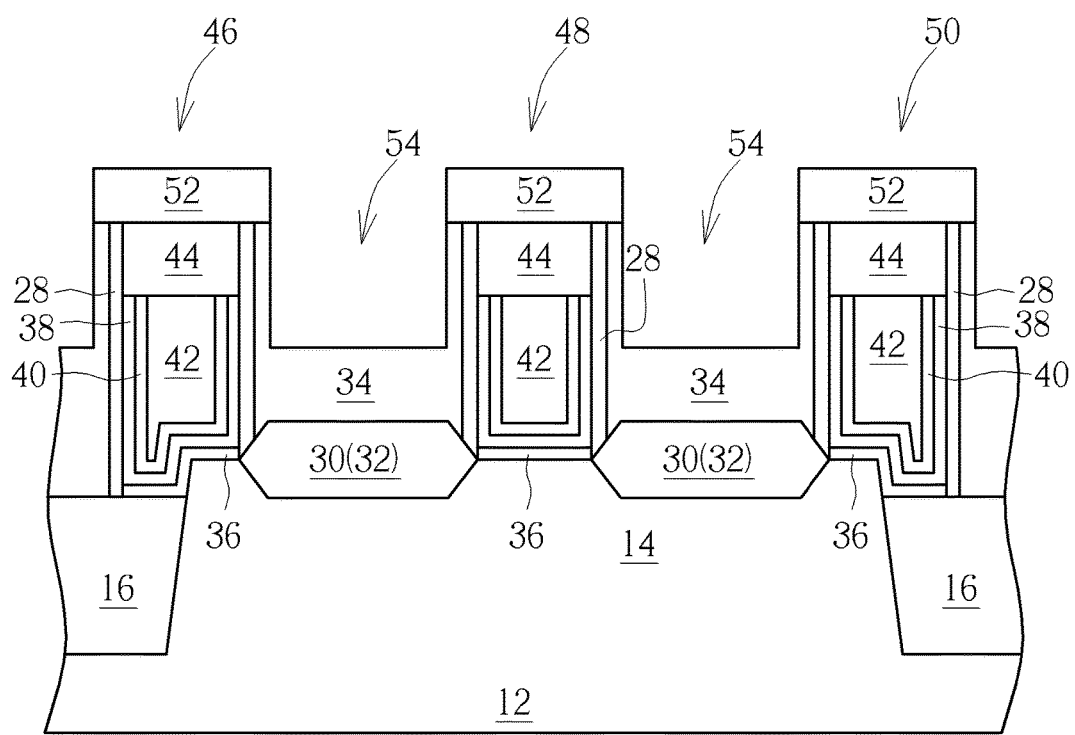

Next, as shown in FIG. 2, an interlayer dielectric (ILD) layer 34 is formed on the gate structure 18, 20, 22, and a planarizing process such as chemical mechanical polishing (CMP) process is conducted to remove part of the ILD layer 34 and part of the CESL (not shown) to expose the gate material layer 26 made of polysilicon, in which the top surfaces of the gate material layer 26 and the ILD layer 34 are coplanar.

Next, a replacement metal gate (RMG) process is conducted to transform the gate structures 18, 20, 22 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate material layer 26 and even the gate dielectric layer 24 to form recesses (not shown) in the ILD layer 34. Next, a selective interfacial layer or gate dielectric layer 36, a high-k dielectric layer 38, a work function metal layer 40, and a low resistance metal layer 42 are formed in the recesses, and a planarizing process such as CMP is conducted to remove part of low resistance metal layer 42, part of work function metal layer 40, and part of high-k dielectric layer 38 to form gate structures made of metal gates 46, 48, 50. In this embodiment, each of the gate structures or metal gates 46, 48, 50 fabricated through high-k last process of a gate last process preferably includes an interfacial layer or gate dielectric layer 36, a U-shaped high-k dielectric layer 38, a U-shaped work function metal layer 40, and a low resistance metal layer 44.

In this embodiment, the high-k dielectric layer 38 is preferably selected from dielectric materials having dielectric constant (k value) larger than 4. For instance, the high-k dielectric layer 38 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 40 is formed for tuning the work function of the metal gate in accordance with the conductivity of the device. For an NMOS transistor, the work function metal layer 40 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 40 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 40 and the low resistance metal layer 42, in which the material of the barrier layer may include titanium (Ti), titanium nitride (TiN), tantalum (Ta) or tantalum nitride (TaN). Furthermore, the material of the low-resistance metal layer 42 may include copper (Cu), aluminum (Al), titanium aluminum (TiAl), cobalt tungsten phosphide (CoWP) or any combination thereof.

Next, part of the low resistance metal layer 42, part of the work function metal layer 40, and part of the high-k dielectric layer 38 are removed to form recesses (not shown) on top of each of the metal gates 46, 48, 50 and within the ILD layer 34, and hard masks 44 made of dielectric material including but not limited to for example silicon nitride are deposited into the recesses so that the top surfaces of the hard masks 44 and ILD layer 34 are coplanar.

After forming the metal gates 46, 48, 50, a cap layer 52 is formed on the ILD layer 34, and a photo-etching process could be conducted by using a patterned mask (not shown) to remove part of the cap layer 52 and part of the ILD layer 34 to form a recess 54 between metal gates 46 and 48 and another recess 54 between metal gates 48 and 50.

Figure 3:
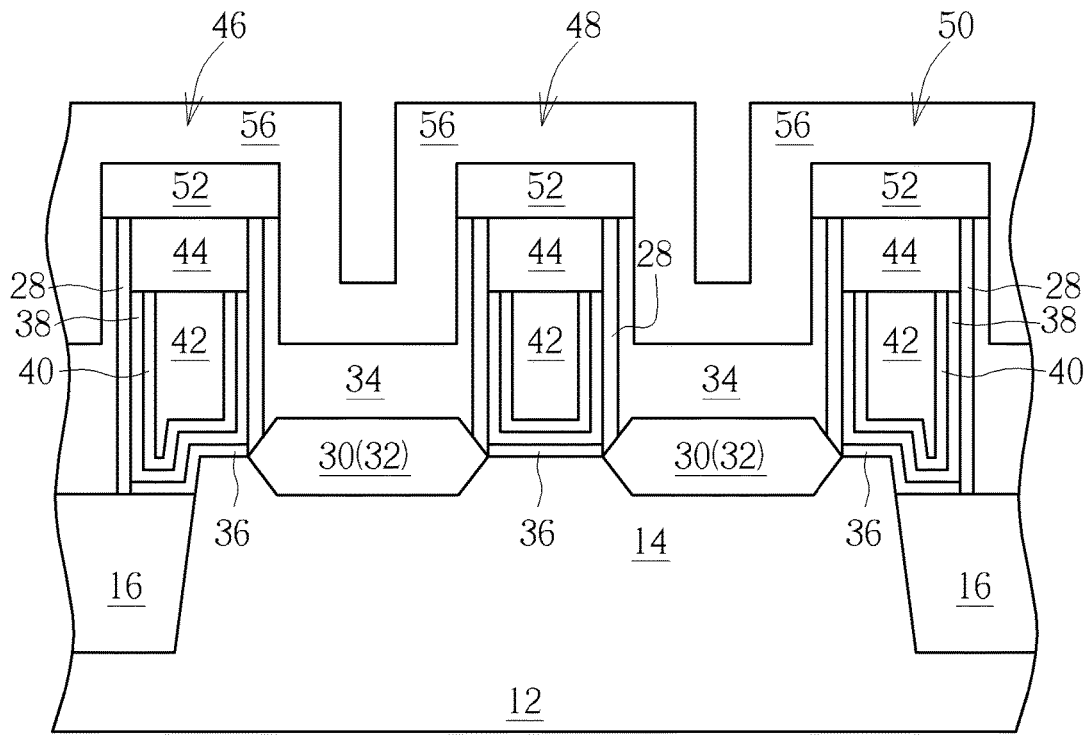

Next, as shown in FIG. 3, a hard mask 56 is conformally formed on the cap layer 52 and into the recess 54. Preferably the hard mask 56 is made of dielectric material including but not limited to for example silicon nitride (SiN).

Figure 4:
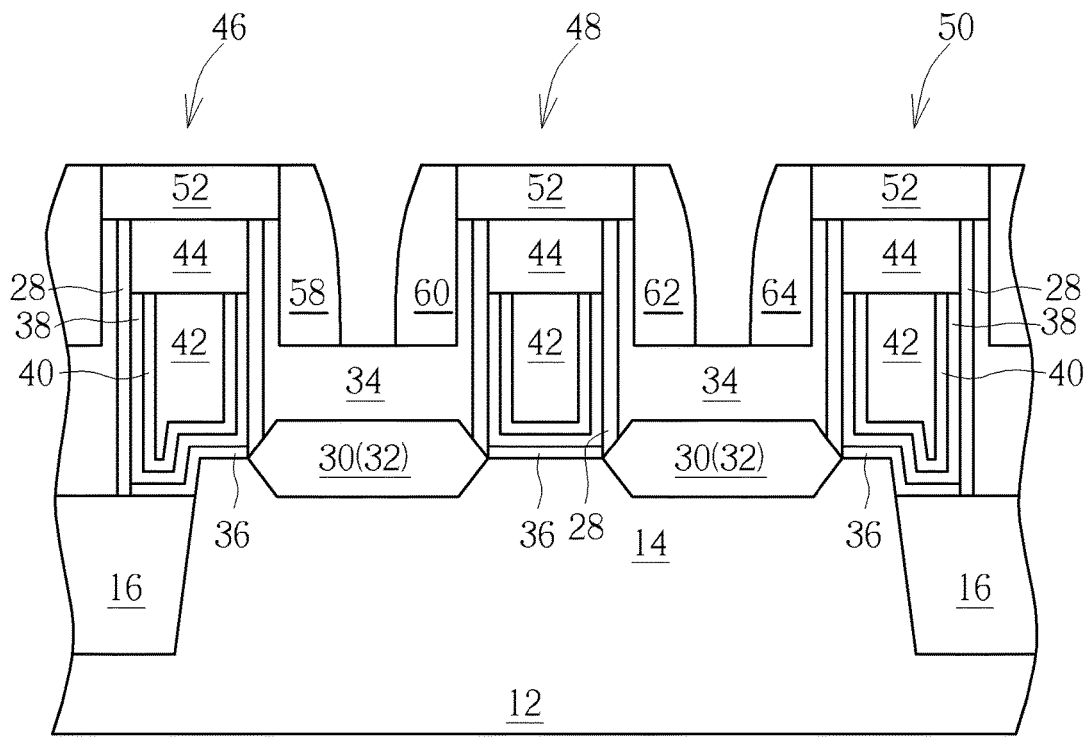

Next, as shown in FIG. 4, an etching process is conducted to remove part of the hard mask 56 to form the spacers 58, 60, 62, 64 in the recesses 54. Specifically, the spacers 58, 60 are formed in the recess 54 between metal gates 46, 48 and spacers 62, 64 are formed in the recess 54 between metal gates 48, 50, in which the spacer 58 is further disposed on a sidewall of the metal gate 46, the spacers 60, 62 are disposed on sidewalls of the metal gate 48, and the spacer 64 is disposed on a sidewall of the metal gate 50.

Figure 5:
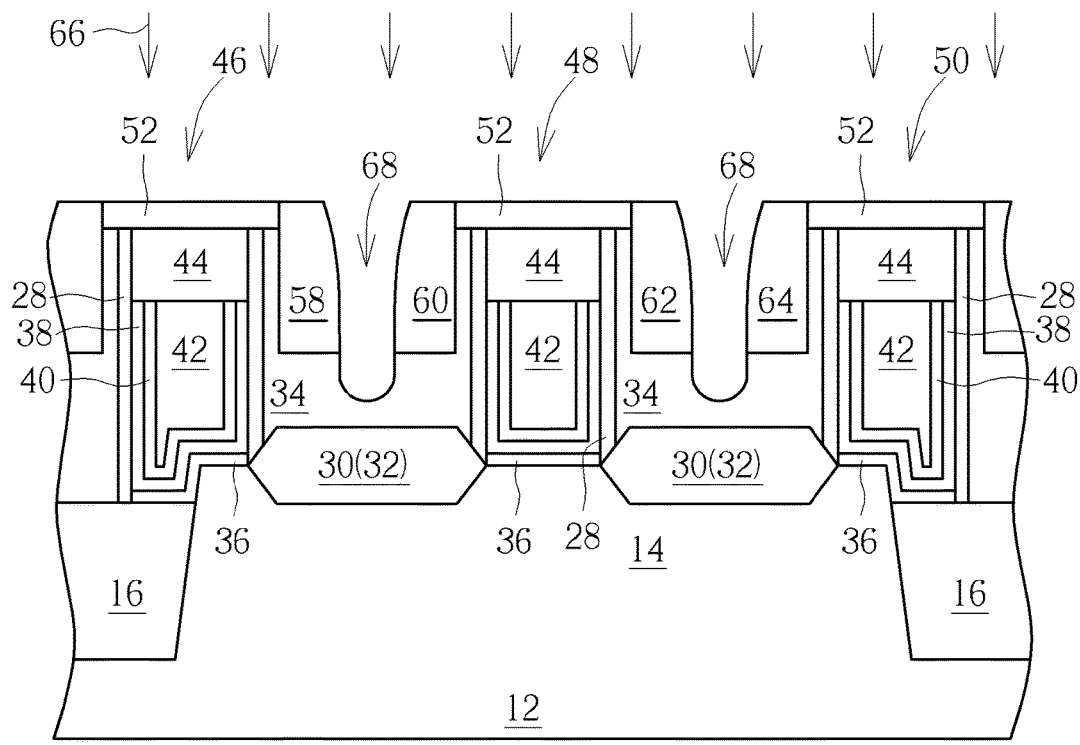

Next, as shown in FIG. 5, a first etching process 66 or preferably a dry etching process is conducted to form first contact holes 68 in the ILD layer 34. Preferably, the first etching process 66 is accomplished by using the spacers 58, 60, 62, 64 as a mask to remove part of the ILD layer 34 particularly along a vertical direction to form a first contact hole 68 between metal gates 46, 48 and another first contact hole 68 between metal gates 62, 64. In other words, the first etching process 66 is preferably a vertical etching process and in this embodiment, the first etching process or dry etching process is conducted by using an etching gas such as but not limited to for example tetrafluoromethane ($CF_4$).

It should be noted that part of the cap layer 52 and even part of the spacers 58, 60, 62, 64 could be consumed during the first etching process 66 so that after the first contact holes 68 are formed the remaining height of the cap layer 52 and spacers 58, 60, 62, 64 could become slightly lower the height of cap layer 52 and spacers 58, 60, 62, 64 shown in FIG. 4. Nevertheless, according to yet another embodiment of the present invention, the cap layer 52 could also be made of dielectric material such as but not limited to for example SiN and in such instance, the cap layer 52 would not be consumed during the first etching process 66 so that the height of the cap layer 52 could be retained.

Figure 6:
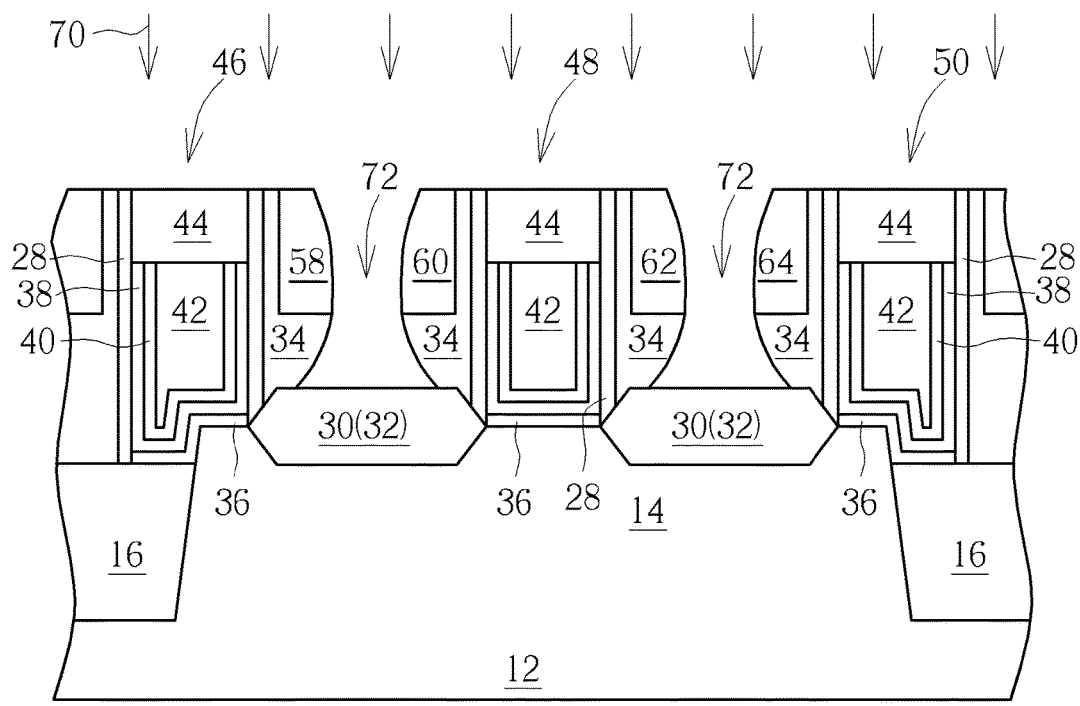

Next, as shown in FIG. 6, a second etching process 70 or preferably a wet etching process is conducted to extend the first contact holes 68 into second contact holes 72. Preferably, the second etching process 70 is accomplished by using the spacers 58, 60, 62, 64 again as mask to extend the first contact holes 68 laterally for forming second contact holes 72 between metal gates 46, 48 and metal gate 48, 50. In other words, the second etching process 70 is preferably a lateral etching process and in this embodiment, the second etching process or wet etching process is conducted by using etchant including but not limited to for example diluted hydrofluoric acid (dHF).

It should be noted that the remaining cap layer 52 and even part of the spacers 58, 60, 62, 64 could further be consumed during the second etching process 70 so that after the second contact holes 72 are formed, none of the cap layer 52 is remained on the hard masks 44 and the top surface of the remaining spacer 58, 60, 62, 64 now becomes even with the top surface of the hard masks 44.

Moreover, it should also be noted that even though a wet lateral etching process (or second etching process 70) is preferably conducted right after the dry vertical etching process (or first etching process 66) to expand the contact holes, according to an embodiment of the present invention, it would also be desirable to conduct an additional third etching process between the first etching process 66 and second etching process 70, in which the third etching process includes a combination of dry etching process with bias power adjustment.

Figure 7:
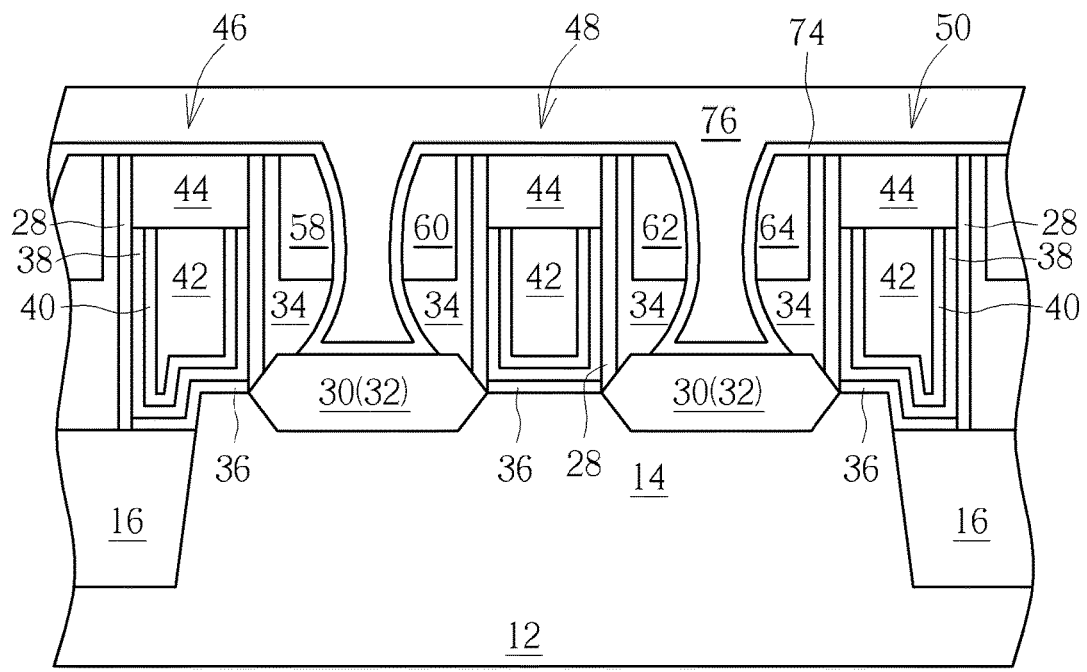

Next, as shown in FIG. 7, a barrier layer 74 is deposited into the recesses 72 and a conductive layer 76 is formed on the barrier layer 74 thereafter to fill the recesses 72 completely. In this embodiment, the barrier layer 74 could be selected from the group consisting of Ti, TiN, Ta, and TaN and the conductive layer 76 could be selected from the group consisting of W, Cu, Al, TiAl, and CoWP.

Figure 8:
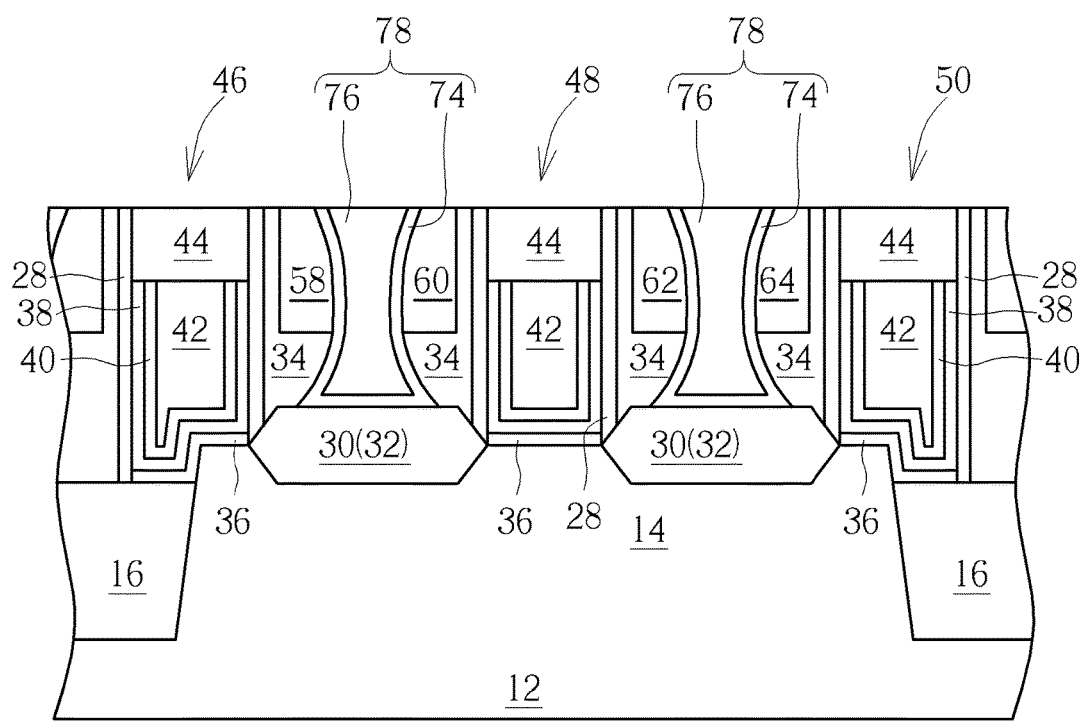

Next, as shown in FIG. 8, a planarizing process such as CMP is conducted to remove part of aforementioned barrier layer 74 and conductive layer 76 for forming contact plugs 78 electrically connecting the source/drain regions 30.

Figure 9:
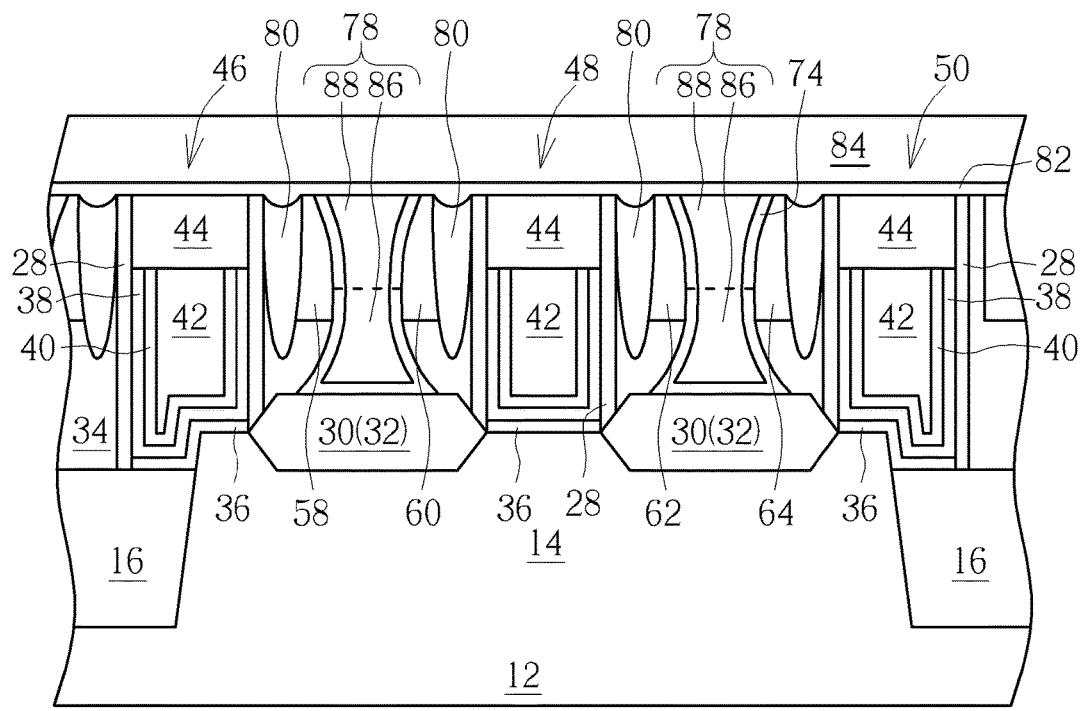

Next, as shown in FIG. 9, another etching process could be conducted to remove part of the spacers 58, 60, 62, 64 and even part of the ILD layer 34 between the contact plugs 78 and the metal gates 46, 48, 50 to form air gaps 80. In this embodiment, the etching process is preferably a wet etching process, which could be conducted by using etchant including but not limited to for example diluted hydrofluoric acid (dHF). Next, a cap layer 82 made of material including but not limited to for example nitrogen doped carbide (NDC) is deposited on the metal gates 46, 48, 50 and contact plugs 78 and an inter-metal dielectric (IMD) layer 84 is formed on the cap layer 82 thereafter. Next, metal interconnective process could be conducted to form additional metal lines or metal interconnections in the IMD layer 84 to electrically connect to the contact plugs 78 depending on the demand of the product. This completes the fabrication of a semiconductor device according to an embodiment of the present invention.

Referring again to FIG. 9, which further illustrates a structural view of a semiconductor device according to an embodiment of the present invention. As shown in FIG. 9, the semiconductor device preferably includes metal gates 46, 48, 50 on a substrate 12 or fin-shaped structure 14, contact plugs 78 between metal gates 46, 48, 50, and an ILD layer 34 and spacers 58, 60, 62, 64 between contact plugs 78 and metal gates 46, 48, 50.

Preferably, each of the contact plugs 78 includes a bottom portion 86 and a top portion 88 on the bottom portion 86, in which a width of the bottom surface of the bottom portion 86 is greater than a width of the top surface of the same bottom portion 86, a width of the top surface of the top portion 88 is greater than a width of the bottom surface of the top portion 88, and the width of the bottom surface of the bottom portion 86 could be equivalent with the width of the top surface of the top portion 88.

Moreover, the top surfaces of the remaining spacers 58, 60, 62, 64 and the top portions 88 are coplanar, the top portion 88 of each of the contact plugs 78 contacts the spacers 58, 60, 62, 64 directly, and air gaps 80 are disposed between the spacers 58, 60, 62, 64 and the metal gates 46, 48, 50. The spacers 58, 60, 62, 64 and the ILD layer 34 are preferably made of different material, in which the spacers 58, 60, 62, 64 are preferably made of dielectric material including but not limited to for example silicon nitride while the ILD layer 34 is made of silicon oxide.

Figure 10:
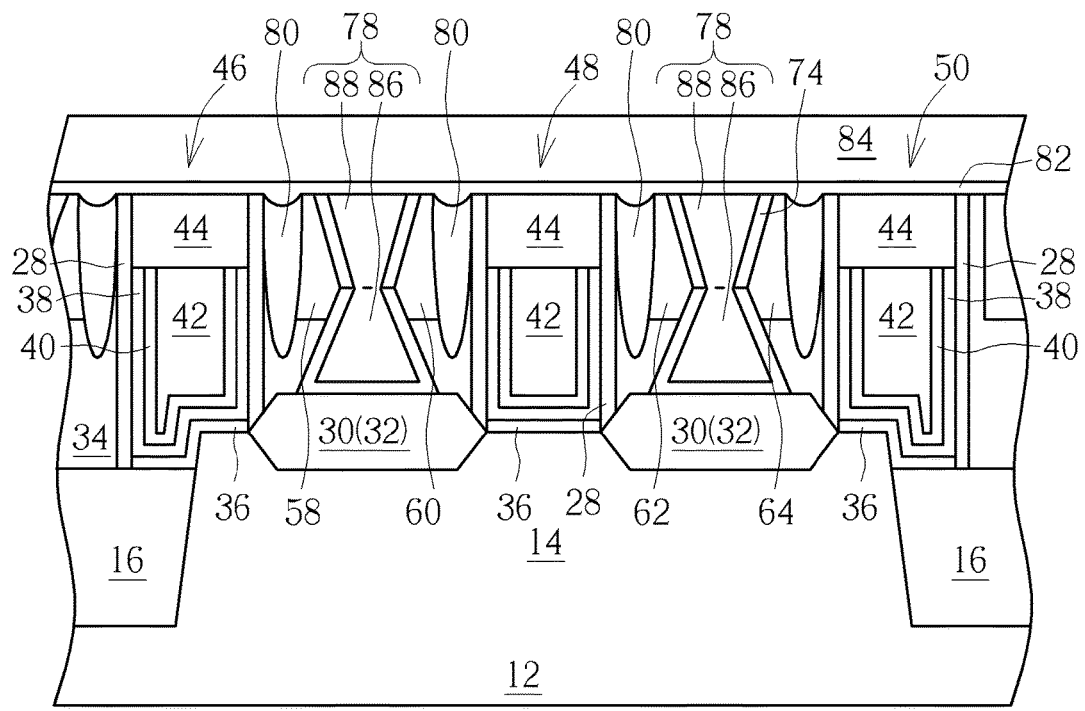
FIG. 10 illustrates a structural view of a semiconductor device according to an embodiment of the present invention.

Referring to FIG. 10, FIG. 10 illustrates a structural view of a semiconductor device according to an embodiment of the present invention. Similar to the structure shown in FIG. 9, the semiconductor device shown in FIG. 10 preferably includes metal gates 46, 48, 50 on a substrate 12 or fin-shaped structure 14, contact plugs 78 between metal gates 46, 48, 50, and an ILD layer 34 and spacers 58, 60, 62, 64 between contact plugs 78 and metal gates 46, 48, 50.

In contrast to the contact plugs 78 from FIG. 9 having curved sidewalls, the sidewall of each of the contact plugs 78, or more specifically a sidewall of the bottom portion 86 and a sidewall of the top portion 88 together constitute a V-shape or V-shaped profile.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   forming a first gate structure and a second gate structure on a substrate and an interlayer dielectric (ILD) layer around the first gate structure and the second gate structure;
   transforming the first gate structure into a first metal gate and the second gate structure into a second metal gate;
   removing part of the ILD layer without exposing a top surface of the substrate between the first metal gate and the second metal gate to form a recess;
   forming a first spacer and a second spacer in the recess between the first metal gate and the second metal gate;
   performing a first etching process by using the first spacer and the second spacer as a mask to remove the ILD layer under the first spacer and the second spacer for forming a first contact hole; and
   performing a second etching process to extend the first contact hole into a second contact hole.

2. The method of claim 1, further comprising:
   forming a cap layer on the ILD layer after forming the first metal gate and the second metal gate;

removing part of the cap layer and part of the ILD layer to form the recess;

forming a hard mask on the cap layer and into the recess;

removing part of the hard mask to form the first spacer and the second spacer.

3. The method of claim 1, wherein the first spacer is on a sidewall of the first metal gate and the second spacer is on a sidewall of the second metal gate.

4. The method of claim 1, further comprising:

forming a barrier layer in the second contact hole; and forming a conductive layer on the barrier layer to form a contact plug.

5. The method of claim 4, wherein the contact plug comprises:

a bottom portion in the ILD layer, wherein a width of a bottom surface of the bottom portion is greater than a width of a top surface of the bottom portion; and a top portion on the bottom portion.

6. The method of claim 5, wherein a width of the top surface of the top portion is greater than a width of a bottom surface of the top portion.

7. The method of claim 5, wherein a sidewall of the bottom portion and a sidewall of the top portion comprise a V-shape.

8. The method of claim 1, wherein the first etching process comprises a dry etching process.

9. The method of claim 1, wherein the first etching process comprises a vertical etching process.

10. The method of claim 1, wherein the second etching process comprises a wet etching process.

11. The method of claim 1, wherein the second etching process comprises a horizontal etching process.

12. A semiconductor device, comprising:

a first metal gate on a substrate and an interlayer dielectric (ILD) layer around the first metal gate; and a contact plug in the ILD layer and adjacent to the first metal gate, wherein the contact plug comprises:

a bottom portion in the ILD layer, wherein a width of a bottom surface of the bottom portion of the contact plug is greater than a width of a top surface of the bottom portion of the contact plug; and a top portion on the bottom portion, wherein a width of a top surface of the top portion of the contact plug is greater than a width of a bottom surface of the top portion of the contact plug.

13. The semiconductor device of claim 12, wherein a width of the top surface of the top portion is greater than a width of a bottom surface of the top portion.

14. The semiconductor device of claim 12, wherein a sidewall of the bottom portion and a sidewall of the top portion comprise a V-shape.

15. The semiconductor device of claim 12, further comprising a second metal gate adjacent to the first metal gate, wherein the contact plug is between the first metal gate and the second metal gate.

16. The semiconductor device of claim 12, further comprising a spacer on a sidewall of the contact plug and on the ILD layer.

17. The semiconductor device of claim 16, wherein the spacer and the ILD layer comprise different material.

18. The semiconductor device of claim 16, wherein the top surfaces of the spacer and the top portion are coplanar.

19. The semiconductor device of claim 16, wherein the top portion contacts the spacer directly.

20. The semiconductor device of claim 16, further comprising an air gap between the spacer and the first metal gate.

* * * * *